United States Patent [19]
Kageyama

[11] Patent Number: 5,939,770
[45] Date of Patent: Aug. 17, 1999

[54] SEMICONDUCTOR DEVICE AND ITS MANUFACTURING METHOD

[75] Inventor: Mokuji Kageyama, Yokohama, Japan

[73] Assignee: Kabushiki Kaisha Toshiba, Kawasaki, Japan

[21] Appl. No.: 09/143,251

[22] Filed: Aug. 28, 1998

[30] Foreign Application Priority Data

Aug. 29, 1997 [JP] Japan .................................. 9-234860

[51] Int. Cl.$^6$ .......................... H01L 29/24; H01L 29/32; H01L 29/36
[52] U.S. Cl. .......................... 257/611; 257/617; 257/913; 438/471
[58] Field of Search .................. 257/617, 913, 257/611; 438/471–477

[56] References Cited

U.S. PATENT DOCUMENTS

| | | | |
|---|---|---|---|
| 4,608,095 | 8/1986 | Hill | 148/33 |
| 5,327,007 | 7/1994 | Imura et al. | 257/611 |
| 5,355,831 | 10/1994 | Schauer | 117/89 |
| 5,401,669 | 3/1995 | Falster et al. | 437/12 |
| 5,403,406 | 4/1995 | Falster et al. | 148/33.2 |
| 5,502,010 | 3/1996 | Nadahara et al. | 437/247 |
| 5,514,897 | 5/1996 | Nakato | 257/611 |
| 5,674,756 | 10/1997 | Satoh et al. | 437/10 |
| 5,698,891 | 12/1997 | Tomita et al. | 257/610 |

*Primary Examiner*—David B. Hardy
*Attorney, Agent, or Firm*—Oblon, Spivak, McClelland, Maier & Neustadt, P.C.

[57] ABSTRACT

A denuded zone DZ least liable to generate defects is formed in a surface layer zone 12 of a semiconductor wafer 10. In an inner layer zone 18 of the semiconductor wafer 10, micro defects BMD for gettering of impurity metal are made. In the inner layer zone 18, the precipitation of oxygen decreases with the depth. As a result, mechanical strength can be maintained while improving the gettering performance of impurity metal.

9 Claims, 9 Drawing Sheets

SAMPLE G

```
┌──────────────────────────┐
│   WAFER FOR SAMPLE A     │
└──────────────────────────┘
            ↓
┌──────────────────────────┐
│   HYDROGEN ANNEALING     │
└──────────────────────────┘
            ↓
┌──────────────────────────┐
│           END            │
└──────────────────────────┘
```

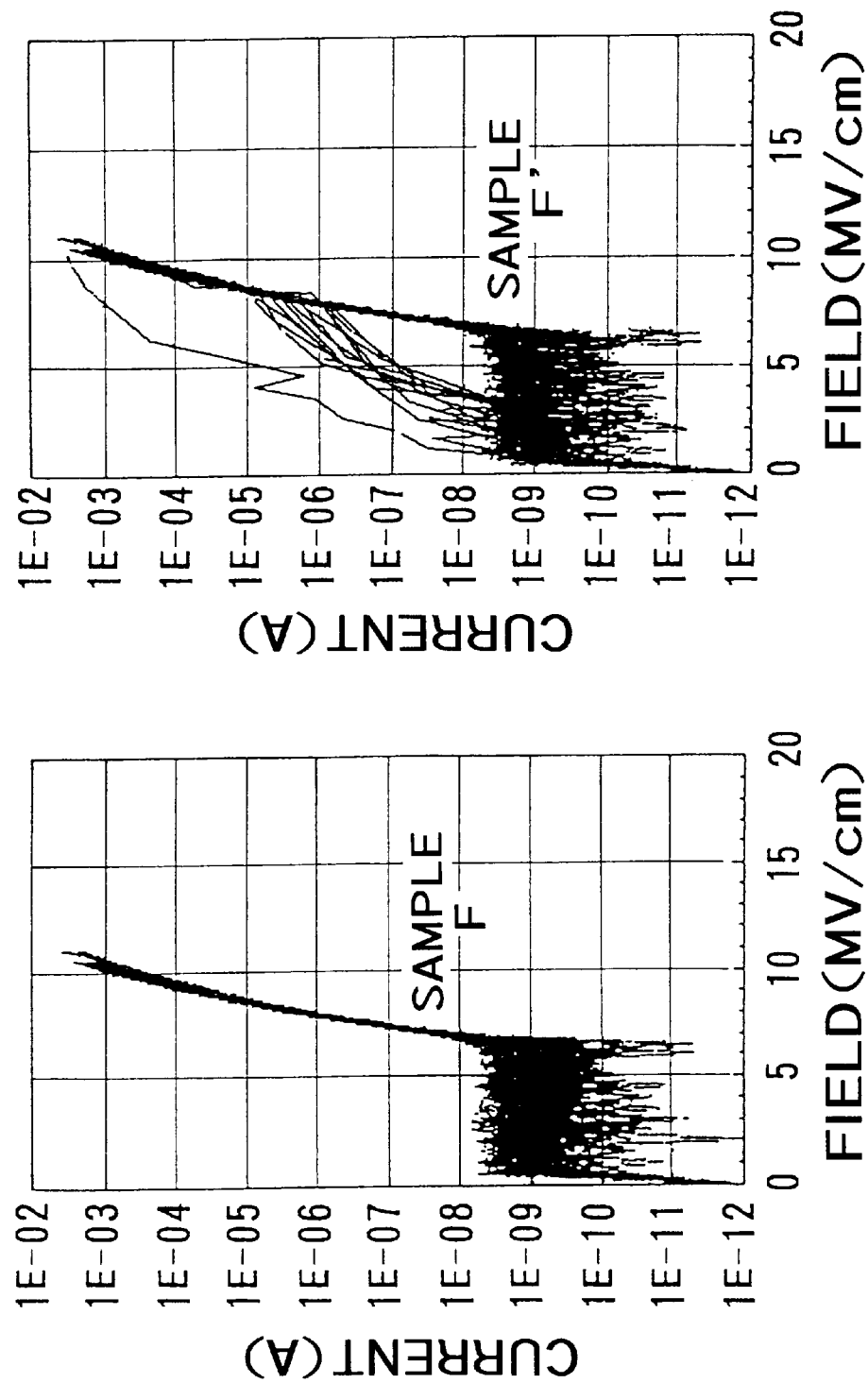

SEMICONDUCTOR DEVICE AND ITS MANUFACTURING METHOD

BACKGROUND OF THE INVENTION

1. Field of the Invention

This invention relates to a semiconductor device and its manufacturing method, especially of a MOS transistor, or the like, having micro defects for gettering.

2. Description of the Prior Art

In a manufacturing process of semiconductor devices, protection of semiconductor substrates from contamination by metal impurities is one of most important techniques for manufacturing processes because such contamination adversely affects significantly to electric characteristics of semiconductor devices. Especially in manufacturing processes of MOS device protection of semiconductor substrate from contamination is quite important. Therefore, efforts are made to clean manufacturing processes by cleaning and purifying manufacturing machines, apparatuses or materials, or by developing cleaning techniques of semiconductor substrate. In addition to these methods, there is a method called gettering to suppress behaviors of metal impurities once diffused into semiconductor substrate.

There are various methods of gettering. One of most effective methods is to make oxygen-induced micro defects (BMD: bulk micro defects) within a semiconductor substrate to use them as capture site of metal impurities. However, it is undesirable that these micro defects exist in a device active layer nearer to a surface of the semiconductor substrate, because metal impurities captured into the micro defects will significantly degrade the electric characteristics of the device. Therefore, when metal impurities are removed from the device active layer by capturing them into the micro defects, it is important not to make micro defects in the device active layer. A non-defective layer with no or very few micro defects is called denuded zone (DZ). The denuded zone is required to be deeper than the device active layer.

In order to make a denuded zone and micro defects, interstitial oxygen has to be present in a semiconductor wafer of silicon, for example. In this respect, the following two methods are generally used to make the denuded zone. In case of a silicon semiconductor wafer, there are the method of additionally stacking a silicon layer without oxygen in a region in which micro defects should be made epitaxial substrate, and the method of annealing the silicon substrate to externally diffuse oxygen from the surface layer zone of the substrate so that the interstitial oxygen concentration decreases in the surface layer zone of the silicon substrate and micro defects are not produced in the surface layer zone. Both these methods control the distribution of micro defects by controlling the distribution of oxygen concentration along the depth. Therefore, the density of micro defects suddenly increases in the transitional region between the denuded zone and the oxygen-educed zone. However, distribution of the micro defects density from the transitional region toward a deeper direction is uniform.

On the other hand, various methods for device isolation semiconductor elements have been developed recently for higher and higher integration of semiconductor element. STI (shallow trench isolation) is one of such isolation techniques for semiconductor devices. When a trench is made in a semiconductor substrate of silicon, or the like, for STI, a stress is liable to be applied to the semiconductor substrate. Moreover, as semiconductor wafers are getting bigger, they are liable to deflect due to its own weight during annealing. It is estimated that the stress applied to the STI zone and deflection of the wafer result in applying a considerable stress to the semiconductor wafer surface layer.

When the stress applied to the semiconductor wafer exceeds a critical value, plastic deformation occurs in the semiconductor wafer. Since plastic deformation accompanies dislocation and its growth, it seriously affects the electric characteristics of the semiconductor device. On the other hand, it is effective for a semiconductor wafer to contain high concentrated interstitial oxygen for a higher mechanical strength thereof. Therefore, it is required to be well-balanced with gettering (creation of micro defects and formation of a denuded zone). Heretofore, however, attention was paid only to control of the entire density of micro defects, and no proposal has been heard of on regulation of mechanical strength of semiconductor wafers by control of the size and density of micro defects in the depth direction of the semiconductor wafer.

SUMMARY OF THE INVENTION

It is therefore an object of the invention to provide a semiconductor device having a sufficient mechanical strength while maintaining a required gettering effect, and a method for manufacturing same. That is, it is intended to provide a semiconductor device and a manufacturing method thereof in which a denuded zone suppressing metal impurities by gettering is formed along a surface of the semiconductor device while, in an inner layer zone immediately under the surface, the amount of precipitated oxygen decreases as the layer becomes deeper.

According to the invention, there is provided a semiconductor device including a semiconductor element on a semiconductor substrate, comprising:

a denuded zone extending along a surface layer zone of said semiconductor substrate nearer to a location in which said semiconductor element is formed, said denuded zone having a lowest density of defects; and an inner layer zone underlying and adjacent said denuded zone, the quantity of precipitated oxygen in said inner layer zone decreasing as the depth progresses.

According to the invention there is further provided a semiconductor device including a semiconductor element on a semiconductor substrate, comprising:

a denuded zone extending along a surface layer zone of said semiconductor substrate nearer to a location in which said semiconductor element is formed, said denuded zone having a lowest density of defects; and an inner layer zone underlying and adjacent said denuded zone, the size of micro defects caused by precipitation of oxygen in said inner layer zone getting smaller and/or the quantity of micro defects in said inner layer zone decreasing as the depth progresses.

According to the invention, there is further provided a semiconductor device comprising:

a surface layer zone in which a denuded zone having the lowest density of defects, said denuded zone including a semiconductor element formed therein;

an intermediate layer zone underlying and adjacent said surface layer zone, and having formed a number of micro defects for gettering of impurity metal; and a deep layer zone underlying and adjacent said intermediate layer zone, and having formed a number of micro defects for gettering of impurity metal, said micro defects in said deep layer zone being smaller in size than said micro defects in said intermediate layer zone, and/or said micro defects in said deep layer zone being lower in density than said intermediate layer zone.

According to the invention, there is further provided a method for manufacturing a semiconductor device comprising the steps of:

bonding a first wafer having a first oxygen concentration and a second wafer having a second oxygen concentration lower than said first oxygen concentration; and annealing the bonded wafers to make a number of micro defects in said first wafer by a first density and to make a number of micro defects in said second wafer by a second density lower than said first density.

According to the invention, there is further provided a method for manufacturing a semiconductor device comprising the steps of:

annealing a first wafer having a first oxygen concentration to make a number of micro defects of a first size;

bonding a second wafer having a second oxygen concentration higher than said first oxygen concentration to said first wafer; and annealing the bonded wafers to make a number of micro defects of a second size larger than said first size in said second wafer.

According to the invention, there is further provided a method for manufacturing a semiconductor device comprising the step of forming an epitaxial layer on a wafer by epitaxial growth, a step of annealing said wafer to made micro defects of a first size in a deep layer zone, micro defects of a second size larger than said first size in an intermediate layer zone, and a denuded zone in an surface layer zone, said denuded zone being low in quantity of generation of defects.

According to the invention, there is further provided a method for manufacturing a semiconductor device configured to process a wafer by hydrogen annealing in hot hydrogen to make in a surface layer zone of said wafer a denuded zone in which the quantity of generated defects is small, and to make in an inner layer zone a number of micro defects which gradually decrease in size as the depth progresses.

BRIEF DESCRIPTION OF THE DRAWINGS

FIGS. 7A and 7B are diagrams showing initial resistance to pressure of oxide films in samples F and F'.

DETAILED DESCRIPTION OF THE PREFERRED EMBODIMENTS (First Embodiment)

The first embodiment of the invention is configured to bond semiconductor wafers prepared by a CZ process so that, in a deep layer zone of a semiconductor device, in which a semiconductor element is formed, the amount of precipitated oxygen decreases as getting deeper. This is explained in greater detail with reference to the drawings.

Figure 1A:
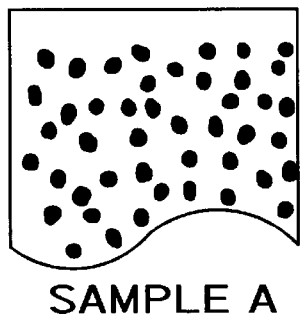
FIGS. 1A through 1D are fragmentary (cross-sectional views of some samples of conventional semiconductor wafers and semiconductor wafers according to the first embodiment in comparison.
Figure 1B:
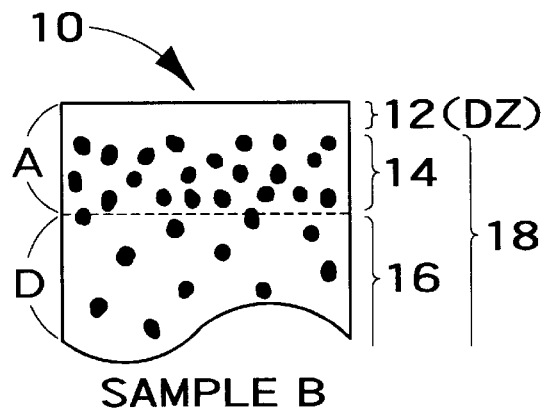
Figure 1C:
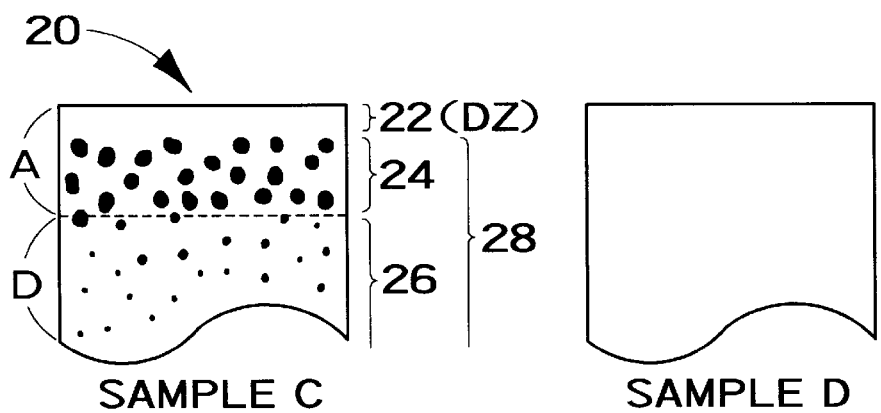
Figure 1D:
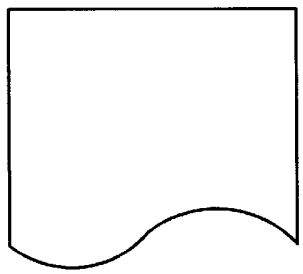

FIGS. 1A through 1D are fragmentary cross-sectional views of semiconductor wafers taken as samples C through D. Sample A shown in FIG. 1A is a conventional semiconductor wafer containing micro defects (illustrated by black points) of equal size are distributed in a uniform density. Sample B shown in FIG. 1B is a semiconductor wafer of a semiconductor device according to the first embodiment of the invention, in which micro defects are equally sized as sample A, but their density is lower in a deeper layer zone. Sample C shown in FIG. 1C is a semiconductor wafer of another semiconductor device according to the first embodiment of the invention, in which micro defects become smaller in size in an inner layer zone, but their density is uniform. Sample D shown in FIG. 1D is a conventional semiconductor wafer with no micro defects.

As shown in FIG. 1B, sample B showing the semiconductor wafer 10 of the semiconductor device according to the first embodiment has formed a denuded zone DZ in its surface layer zone 12. The denuded zone DZ includes no micro defects BMD. Therefore, the surface layer zone 12 of the denuded zone DZ is used as a device active layer in which a semiconductor element is formed. In FIGS. 1A through 1D (also in FIGS. 3A, 3B and FIG. 5), the semiconductor element formed in the denuded zone DZ is not illustrated.

The zone underlying the surface layer zone 12 is an intermediate layer zone 14. The intermediate layer zone 14 has formed micro defects BMD. These micro effect in the intermediate layer zone 14 represent a relatively high density. Distribution of the density and distribution of the size of micro defects BMD in the intermediate layer 14 are uniform.

The zone underlying the intermediate layer zone 14 is an deep layer zone 16. Also the deep layer zone 16 has,, formed micro defects BMD. These micro defects BMD in the deep layer zone 16 represent a relatively low density. That is, the density of micro defects BMD in the deep layer zone 16 is lower than the density of micro defects BMD in the intermediate layer zone 14. As to the size, however, both the micro defects BMD in the deep layer zone 16 and the micro defects BMD in the intermediate layer zone 14 are equal. Distribution of the density of micro defects BMD and distribution of the size of micro defects BMD are uniform within the deep layer zone 16, respectively.

The intermediate layer zone 14 and the deep layer zone 16 made inner layer zone 18. That is, the inner layer zone 18 underlies the surface layer zone 12.

As shown in FIG. 1C, also the sample C showing a semiconductor wafer of another semiconductor device according to the invention includes a surface layer zone 22, intermediate layer zone 24 and deep layer zone 26, and the intermediate layer zone 24 and the deep layer zone 26 make an inner layer zone 28.

However, sample C is different from sample B in the following points. That is, distribution of the density of micro defects BMD is common to the intermediate layer zone 24 and the deep layer zone 26, and it is uniform within each layer. On the other hand, the size of micro defects BMD in the deep layer zone 26 is smaller than the size of micro defects BMD in the intermediate layer zone 24.

Next explained are methods for manufacturing these samples B and C.

Used as semiconductor wafers for manufacturing samples A through C are p-type crystals of 1~6 Ωcm. For manufacturing sample A, a semiconductor wafer having the oxygen concentration of $1.7 \times 10^{18}$ cm$^{-3}$ (Old ASTM equivalent) is sued. For manufacturing sample D, a semiconductor wafer having the oxygen concentration of $1.3 \times 10^{18}$ cm$^{-3}$ is used.

Figure 1E:
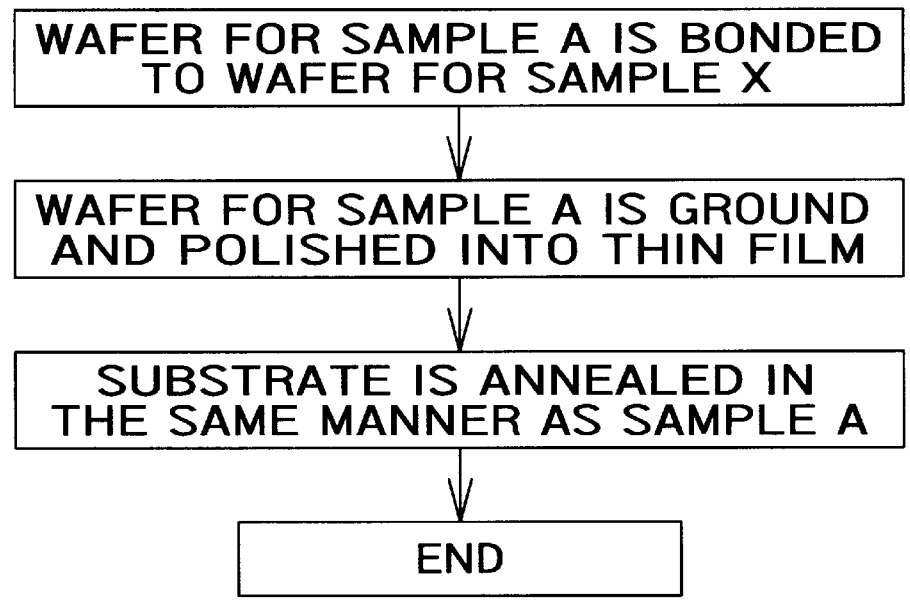
FIG. 1E is a flow chart of a manufacturing process of the semiconductor wafer (sample B) according to the first embodiment of the invention.

For manufacturing sample B, the wafer having the oxygen concentration of $1.7 \times 10^{18}$ cm$^{-3}$ for manufacturing sample A is directly bonded to a wafer as sample X having the oxygen concentration of $1.4 \times 10^{18}$ cm$^{-3}$ lower than the oxygen concentration of the wafer for manufacturing sample A. They are bonded directly without interposing a thermal oxide film so that the wafer for manufacturing sample A appears in front of the other wafer. The bonded wafer is ground and polished from the side of sample A into a thin film. Then, the substrate is annealed similarly to sample A. That is, it is annealed in the order of 1200° C., 800° C. and 1000° C. As a result, the semiconductor wafer 10 of sample B is obtained. The flow of the process explained above is shown in FIG. 1E. In the annealing process, annealing required in the process for making a semiconductor element in the denuded zone DZ must be taken into consideration. For example, if annealing of 1000° C. is necessary in the process for making the semiconductor element, the last annealing of 1000° C. should be omitted in the annealing process of the wafer. However, a current trend; temperature lowering of device production process, may need no high temperature process affecting the size and density of micro defects BMD already made in the wafer in the process for manufacturing the semiconductor element. In this case, the size and density of micro defects BMD once made in the wafer in the annealing process before fabrication of the semiconductor element can be maintained even after fabrication of the semiconductor element.

Figure 1F:
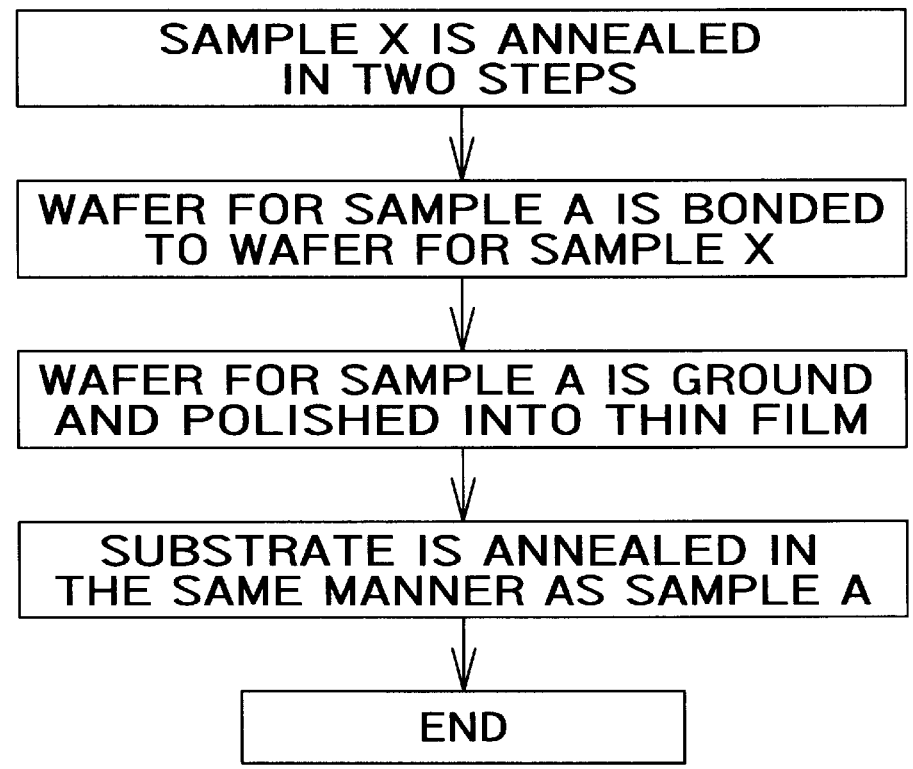
FIG. 1F is a flow chart of a manufacturing process of the semiconductor wafer (sample C) according to the first embodiment of the invention.

For manufacturing sample C, a wafer containing oxygen of a concentration similar to that for sample B and lower than that for sample A is prepared. That is, a wafer of sample X having the oxygen concentration of $1.4 \times 10^{18}$ cm$^{-3}$ is prepared. By annealing this wafer separately, micro defects BMD are made in a density equivalent to sample A. That is, two-step annealing using a low temperature former and a high temperature later is performed. After small-sized micro defects BMD are made in the annealing process, the wafer for manufacturing sample A is directly bonded on the wafer without interposing a thermal oxide film. After that, the bonded wafer is ground and polished from the surface of the sample A side to shape it into a thin film as a front surface which forms semiconductor devices. Thereafter, annealing is done in the same conditions as those for sample A, namely, in the order of 1200° C., 800° C. and 1000° C. During the annealing, since sufficient micro defects BMD are made in the lower wafer (the wafer of sample X) by the two-step annealing before both wafers are bonded, no significant change appears in the density and size of micro defects even after the subsequent third-step annealing similar to sample A. As a result, the semiconductor wafer 20 of sample C is obtained. The flow of the process explained above is shown in FIG. 1F.

Broken lines in FIGS. 1B and 1C show interfaces between bonded wafers.

Micro defects BMD in sample C were measured by using a infrared laser. As a result, a large difference as large as a double was confirmed in intensity of scattering light between the intermediate layer zone 24 and the deep layer zone 26. Then, the micro defects BMD in the intermediate layer zone 24 and the deep layer zone 26 were observed through TEM (transmission electron microscopy). As a result, the size of micro defects BMD in the intermediate layer zone 24 was larger by approximately 10% than the size of micro defects in the deep layer zone 26. That is, micro defects in the intermediate layer zone 24 were confirmed to have the size approximately 1.1 times the size of micro defects in the deep layer zone 26. It is generally believed that the intensity of the scattering light is proportional to 6th power of the radius of the scattering source to be measured. Also from calculation in this respect, the result of observation by TEM is proved to be true. The maximum difference in size between the micro defects in the intermediate layer zone 24 and the micro defects BMD in the deep layer zone 26 is estimated to be approximately 4.7 times, considering the nature of micro defects BMD. In the instant case, the ratio of scattering light of the infrared laser is approximately $10^4$.

Wafer structures, densities of micro defects and sizes of micro defects of these samples are shown in Table 1.

TABLE 1

| Sample | Wafer Structure | BMD Density | BMD Size |
|---|---|---|---|
| A | CZ | Constant | Constant |
| B | Bonding | Lower in Deep | Constant |
| C | Bonding | Constant | Smaller in Deep |
| D | CZ | None | None |
| E | Epitaxial | Constant | Smaller in Deep |
| F | Epitaxial (Highly Doped) | Constant | Smaller in Deep |
| G | Hydrogen Annealing | Constant | Smaller in Deep |

Next reviewed are characteristics of samples A through D. In order to estimate the characteristics, the following tests (a), (b), (c) and (d) were made on samples A through D.

(a) comparison in terms of gettering power or performance against metal contamination by intentionally contamination by Fe and by annealing to diffuse Fe (b) mechanical strength test under a high temperature by four-point bending test at a high temperature (c) comparison in terms of production yield of devices when a predetermined semiconductor device is made in each sample (d) comparison in terms of amount of crystal defects made by annealing after making a trench along the surface by dry etching and deposition of $SiO_2$ by CVD method.

Figure 2:
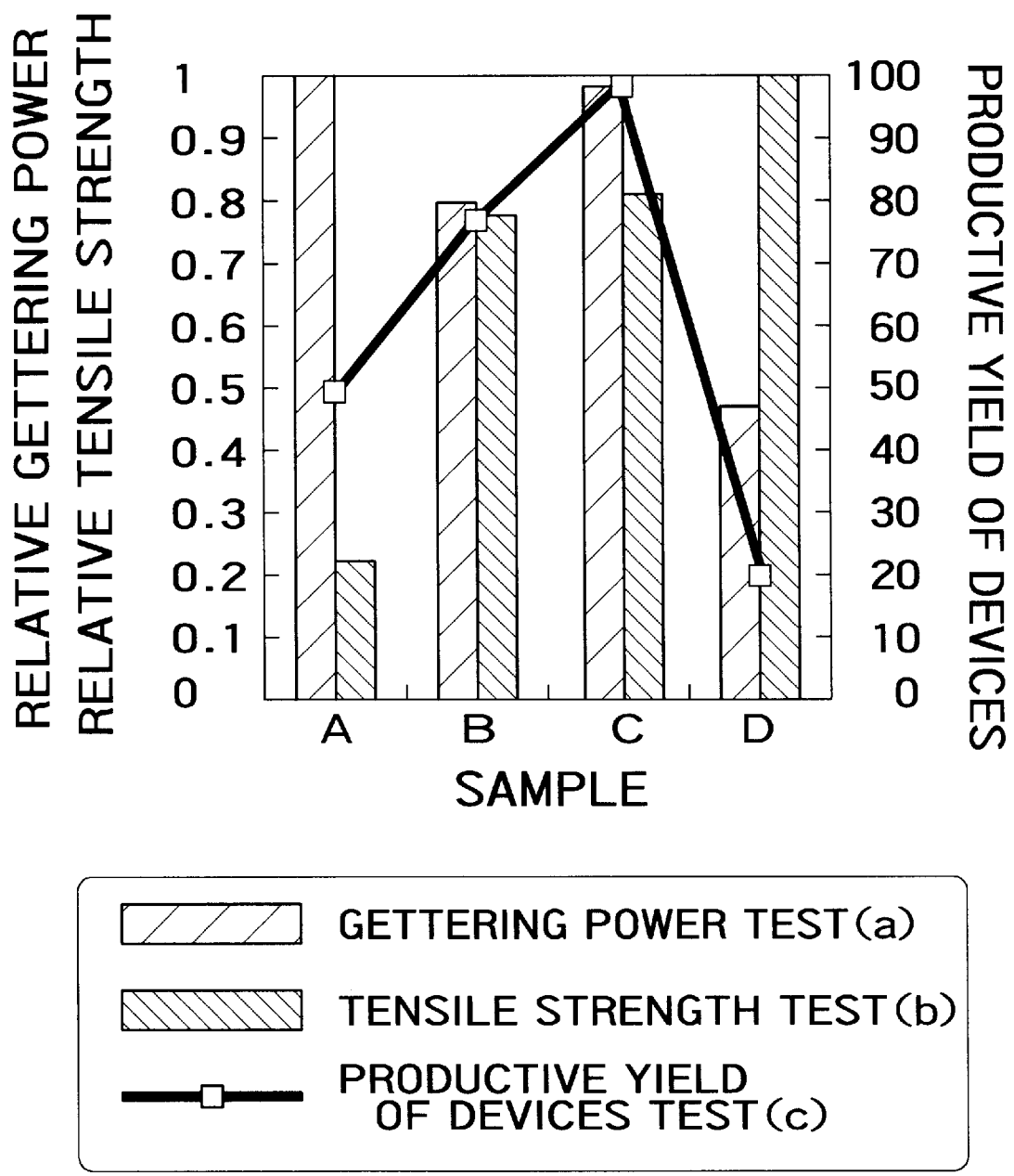
FIG. 2 is a graph showing gettering performance, tensile strength and production yield of devices on samples A, B, C and D.

Results of these tests are shown in FIG. 2. Samples A through D are shown along the horizontal axis. The left vertical axis shows relative gettering performance when determining sample A as 1 (test (a)), and relative tensile strength when determining sample D as 1 (test (b)). The right vertical axis shows production yields of devices in percentage (test (c)). As to test (d), since it resulted substantially equal for all samples, it is omitted from FIG. 1. The denuded zone DZ was formed to the depth of 20 μm from the surface in all examples except for sample D, and no special objection was found along the bonded interfaces in samples B and C.

In test (a), the samples were contaminated by Fe of $1×10^{12}$ cm$^{-3}$ on their surfaces, and processed by diffusion annealing at 1000° C. for one hour. After that, Fe concentrations along the surface layer zones 12 and 22 were measured by a deep level transition spectroscope (DLTS). As a result, as shown by left bars of respective samples in FIG. 2, Fe concentrations in the surface layer zones 12 and 22 of individual samples showed the following relation.

sample A=sample C<sample B<sample D

That is, in terms of gettering performance, samples A and C are best. From the fact that Samples B and C are different in gettering performance, it is estimated that the density of micro defects BMD would more strongly affect the gettering, performance than the size of micro defects BMD.

Test (b) was effected at 1000° C. in an Ar ambient. As a result, as shown by right bars of respective samples in FIG. 2, there was the following relation among samples in terms of tensile strength.

sample D>sample C>sample B>sample A

Since electric characteristics of a semiconductor element are deteriorated by metal impurities, and the quantity of produced crystal defects varies depending upon the resistance to heat, the material characteristics of these samples are considered to be better in the order of sample C>sample B>sample A>sample D As explained above, according to the semiconductor wafers 10, 20 according to the embodiment, since micro defects BMD are made in the intermediate layer zones 14, 24 of the semiconductor wafers 10, 20, and micro defects BMD of a lower density or a smaller size are made in the deep layer zone 16, 26, the semiconductor wafers 10, 20 maintain gettering performance against metal impurities while maintaining a mechanical strength. That is, by decreasing the density or reducing the size of micro defects BMD in the deep layer zones 16, 26, interstitial oxygen in the deep layer zones 16, 26 is maintained in a high concentration. Therefore, the quantity of precipitated oxygen in the deep layer zones 16, 26 decreases, and the deep layer zones 16, 26 containing sufficient oxygen increase the mechanical strength of the semiconductor wafer 10. At the same time, micro defects BMD formed in the intermediate layer zones 14, 24 performs gettering of metal impurities from the surface layer zones 12, 22, and suppress contamination by metallic contaminants. Considering the path of "surface contamination—diffusion—gettering", the reason might be that sufficient gettering performance of micro defects BMD to prevent metal contamination is ensured by making micro defects BMD in the intermediate layer zone 14, 24 nearer to the surface layer zone 12, 22. That is, making more effective gettering site nearer to the surface layer zones 12, 22 would be better to cope with contamination in a process decelerating diffusion of metal contamination, such as low temperature process.

When the density of micro defects BMD is decreased in the deep layer zone 16, like sample B, it result in reducing the number of gettering sites. Therefore, it has been confirmed that the size of micro defects BMD in the deep layer zone 26 had better be smaller to more effectively cope with metal contamination. As shown by the graph connecting plotted points by lines in FIG. 2, sample C was confirmed to be better as a result of actual comparison of samples in terms of production yield of devices (test (c)).

(Second Embodiment)

The second embodiment prepares two kinds of wafers as additional samples E and F.

Figure 3A:
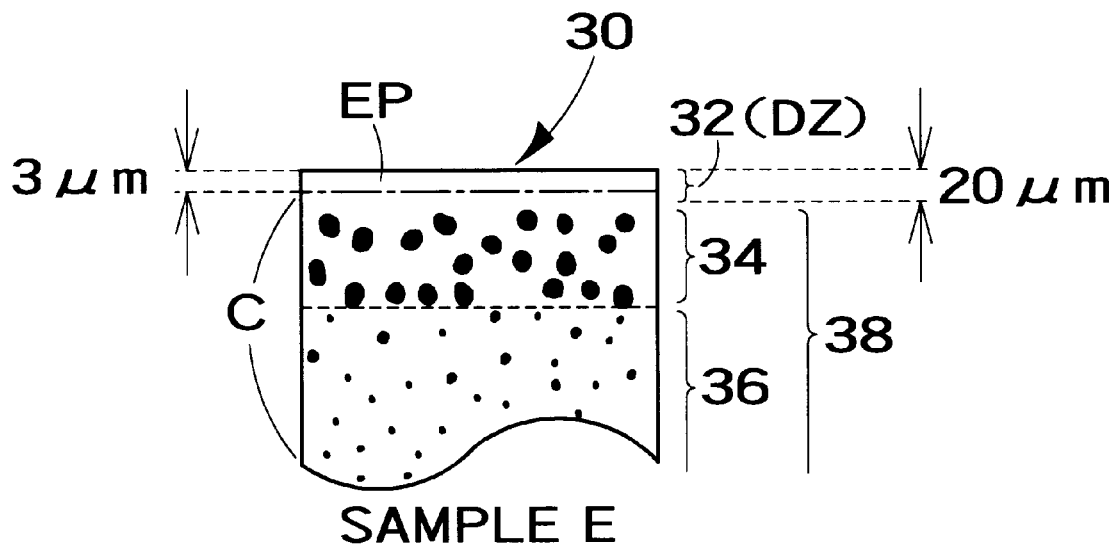
FIG. 3A and 3B are fragmentary cross-sectional views of semiconductor wafers (sample E and sample F) according to the second embodiment of the invention.
Figure 3B:
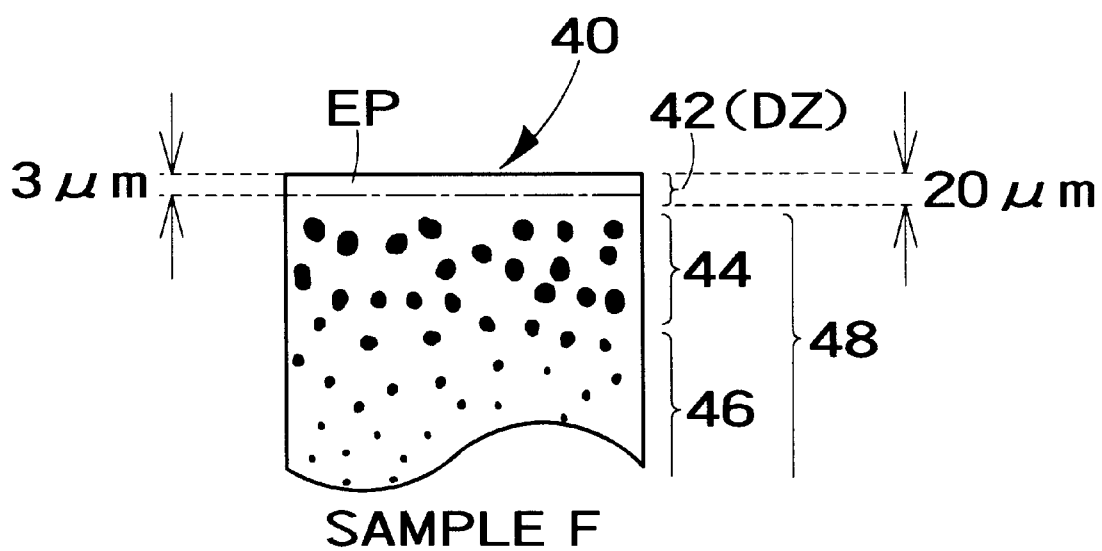

FIG. 3A and FIG. 3B are fragmentary cross-sectional views of samples E and F which are semiconductor wafers of semiconductor devices according to the second embodiment. Sample E shown in FIG. 3A is a semiconductor wafer in which a silicon (Si) single-crystal layer is epitaxially grown on sample C. Sample F shown in FIG. 3B is an epitaxial wafer in which an epitaxial layer is formed on a semiconductor wafer having a distribution of micro defects similar to sample E, using a CZ wafer with a boron concentration of $1×10^{19}$ cm$^{-3}$ or more as its substrate.

Figure 3C:
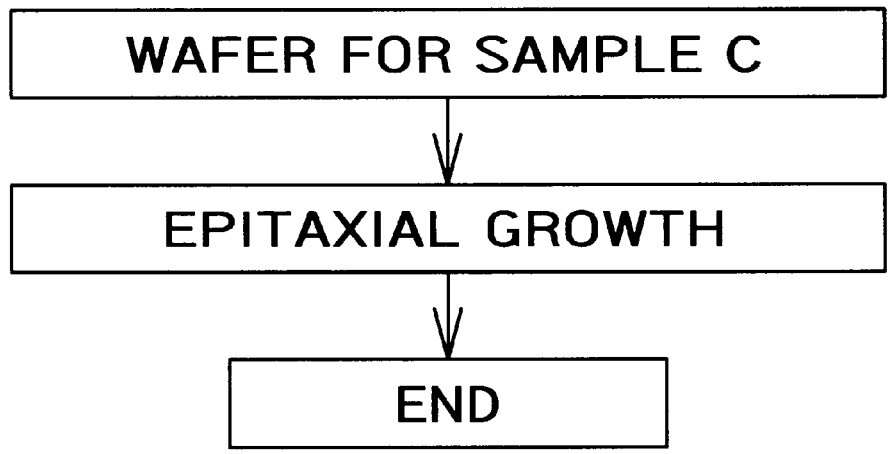
FIG. 3C is a flow chart of a manufacturing process of the semiconductor wafer (sample E) according to the second embodiment of the invention.

As shown in FIG. 3A, sample E includes an epitaxial layer EP having a thickness of approximately 3 μm formed by CVD (epitaxial growth) on sample C of CZ wafer prepared in the first embodiment. The surface layer zone 32 including the epitaxial layer EP is the denuded zone DZ. The denuded zone DZ is 20 μm thick approximately. As a result, the semiconductor wafer 30, which is an epitaxial wafer having a wafer structure similar to sample C, can be obtained. The flow of the process explained above is shown in FIG. 3C.

Since the sample E is made on the basis of sample C, the size of micro defects BMD in the deep layer zone 36 is smaller than the size of micro defects BMD in the intermediate layer zone 34, like sample C. On the other hand, the density of micro defects BMD in the deep layer zone 36 is equivalent to the density of micro defects BMD in the intermediate layer zone 34. The intermediate layer zone 34 and the deep layer zone 36 form the inner layer zone 38.

Figure 3D:
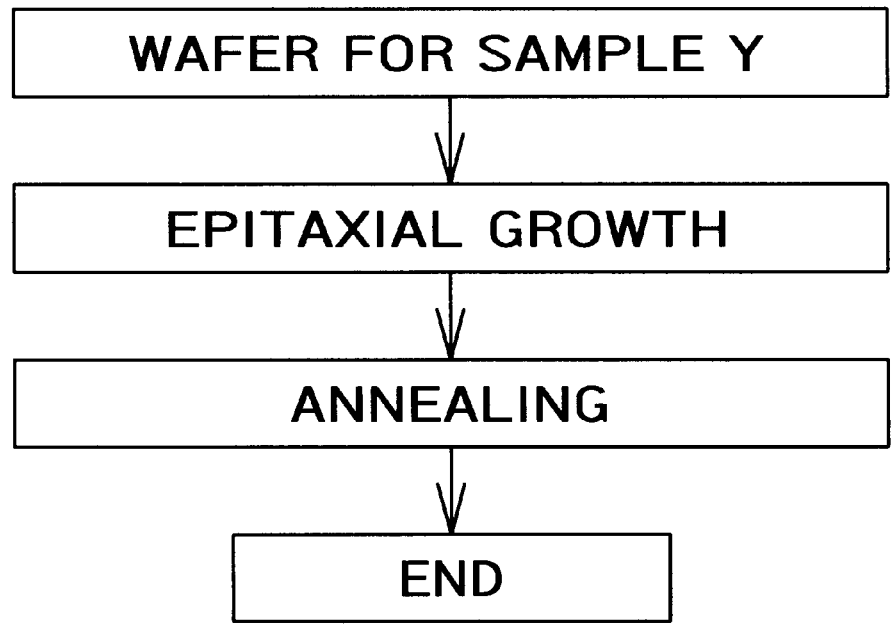
FIG. 3D is a flow chart of a manufacturing process of a semiconductor wafer (sample F) according t o the second embodiment of the invention.

As shown in FIG. 3B, sample F is made by forming a p-type epitaxial layer EP with a specific resistance of approximately 1 to 5 Ωcm on a p-type wafer of a specific resistance of 0.01 Ωcm as sample Y. The epitaxial layer EP is 3 μm thick approximately. For making the epitaxial layer EP, the wafer is introduced into an epitaxial growth apparatus under the normal temperature. After the epitaxial layer EP is formed at 1200° C. approximately, the wafer is again cooled to the normal temperature, and taken out from the apparatus. While the temperature is increased from the normal temperature to 1200° C., the carrier gas is chanced from $N_2$ to $H_2$. The lower the temperature upon changing to $H_2$, the clearer the size distribution of micro defects BMD. After that, by appropriately annealing the wafer, micro defects BMD having a size distribution tendency similar to sample C are made. That is, micro defects BMD in the inner layer zone 38 are made to gradually become smaller in size toward the deep layer zone 46. However, the density of micro defects BMD in the deep layer zone 46 is equivalent to the density of micro defects BMD in the intermediate layer zone 44. The inner layer zone 48 consist of the intermediate layer zone 44 and the deep layer zone 46. In the surface layer zone 42 overlying the inner layer zone 48, the denuded 2, one DZ with a thickness of approximately 20 μm is formed. As a result, the semiconductor wafer 40 is obtained. The flow of the process explained above is shown in FIG. 3D.

Structures, densities of micro defects and sizes of micro defects of these samples E and F are also shown in Table 1 shown above.

Next reviewed are characteristics of samples E and F in comparison with sample C. In order to estimate the characteristics, tests (a), (b), and (d) in the first embodiment were made on samples E, F and C.

Figure 4:
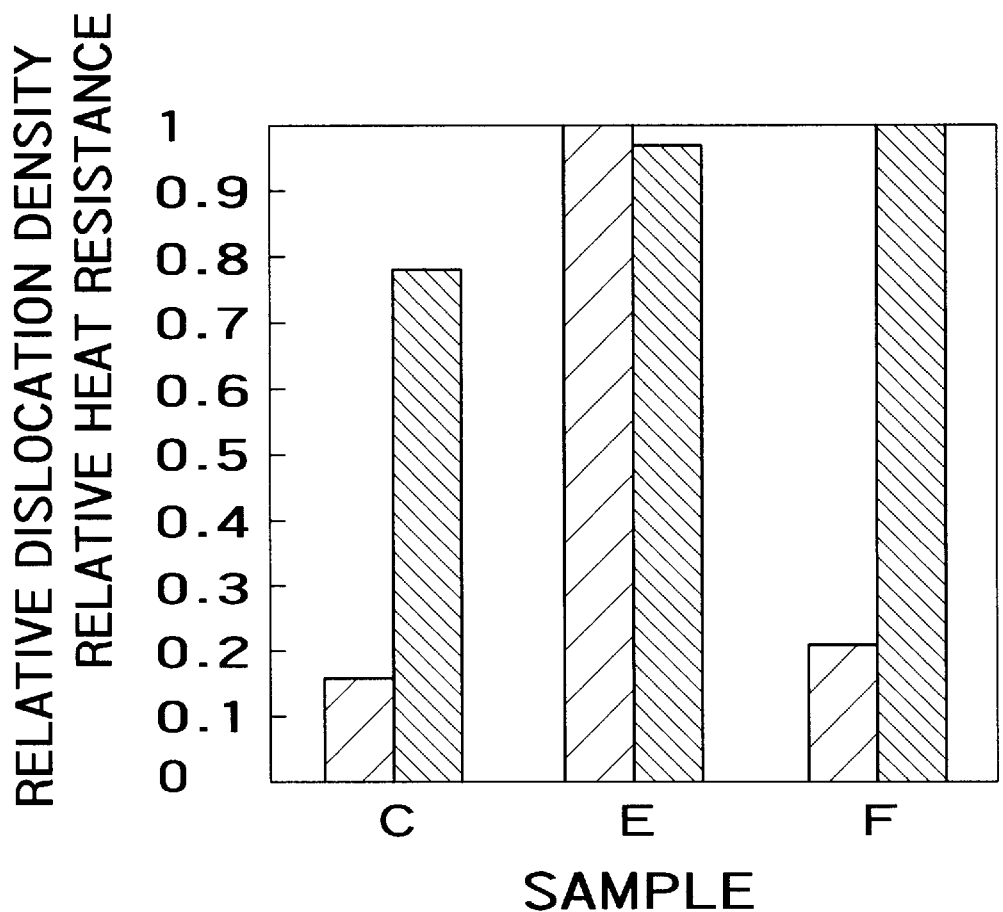
FIG. 4 is a graph showing relative density of dislocation and relative heat resistance of samples C, E and F.
Figure 4:
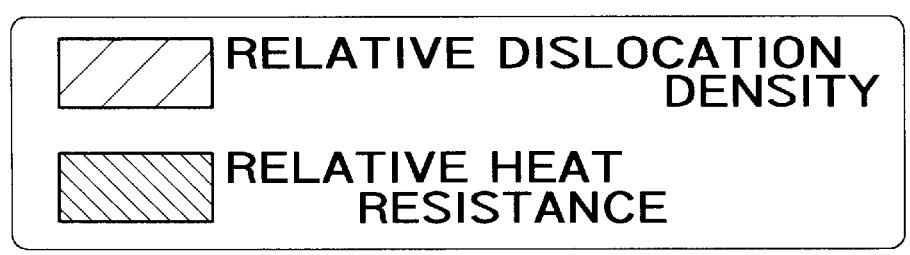

As a result of comparison between sample C and sample E, no difference was found between them by tests (a) and (b). In test (d), however, the quantity of dislocation caused by inside strain derived from the difference in thermal expansion coefficient between the CVD film and the Si substrate was larger in sample E than in sample C. Results of test (d) are shown by left bars of individual samples in FIG. 4 where relative dislocation density and relative heat resistance of samples C, E and F are shown. The horizontal axis in FIG. 4 shows samples C, E and F. The vertical axis relative dislocation density, determining sample E as 1, and relative heat resistance, determining sample F as 1. As apparent from left bars in FIG. 4, relative dislocation density is lower in sample C than in sample E.

Through a further investigation, it was confirmed that the oxygen concentration in the denuded zone DZ of sample E was lower than the oxygen concentration in the denuded zone DZ of sample C. The lower oxygen concentration may be the reason of a decrease in mechanical strength of the surface layer zone 32 of the silicon substrate in sample E. Then, it is considered that the difference in mechanical strength appeared as the difference in quantity of defects, namely dislocation.

This tendency, however, was not found in sample F. That is, when the wafer with a high boron concentration was used as the substrate, this tendency was not found. Additionally, since sample F is doped with high-concentrated boron, the size distribution of micro defects BMD can be controlled only by annealing.

As understood from FIG. 4, sample F exhibited a high mechanical strengthens when compared with sample C. The reason lies in that a larger number of micro defects BMD were made in a short annealing process, and the oxygen concentration in the denuded zone DZ excluding the transition region along the epitaxial interface between the epitaxial layer EP and the denuded zone DZ is not different from the oxygen concentration either in the intermediate layer zone 44 or in the deep layer zone 46. That to is, it is because the decrease in oxygen concentration in the denuded zone DZ is very small. Therefore, it can be assumed that a decrease in mechanical strength caused by a decrease in oxygen concentration did not occur.

The phenomenon can be applied also to countermeasure against slip in high temperature annealing of large-diameter wafers. That is, during high temperature annealing, wafer is liable to deflect due to deterioration of its mechanical strength. Although the resistance to deflection can be expressed in moment of interlia of area, since its value is proportional to the square of the thickness, the effect is strongly affected by the mechanical strength along the surface therefore, since oxygen is not removed from the surface layer portion of the wafer, sample F exhibited an improvement in heat resistance as large as 2 through 3% relative to sample E as shown in FIG. 4.

When measuring sample F by IR tomography, intensity distribution of scattering light by micro defects BMD has a maximum value within the depth of approximately 50 $\mu$m from the surface, and gradually decreases as getting deeper. At the depth of approximately 150 $\mu$m from the surface, intensity distribution of scattering light becomes substantially constant. Relative intensity of the scattering light is confirmed to change by double or more, similarly to the former example. Sample F, in particular, is characterized in the concentration of interstitial oxygen in the denuded zone DZ just before the depth where the intermediate layer zone 44 containing high-concentrated micro defects BMD begins. That is, concentration of interstitial oxygen in the denuded zone DZ is higher than the concentration of interstitial oxygen in the region where micro defects BMD are made. In other words, the denuded zone DZ more oxygen in solid solution, and it is advantageous from the viewpoint of the strength of the wafer as explained above.

As explained above, according to the semiconductor wafers 30, 40 according to the second embodiment, since micro defects BMD are made in the intermediate layer zones 34, 44 of the semiconductor wafers 30, 40, and micro defects BMD with a smaller size are made in the deep layer zone 36, 46, the semiconductor wafers 30, 40 maintain gettering performance against metal impurities while maintaining a mechanical strength.

Additionally, sample F can much more improves the gettering performance by the effect of boron. Further, larger-sized micro defects are present in the intermediate layer zone 44 near the surface layer zone 42, Cu, Ni or other metal difficult for gettering by boron can be captured by gettering probably because Cu, Ni and some other metals are captured by gettering in secondary-generated strain or dislocation which will occur when micro defects are formed. If so, according to sample F, by making larger-sized micro defects BMD in the intermediate layer zone 44, it is possible to make a region with a distortion in the intermediate layer zone 44 inside the semiconductor wafer, and a region with a distortion can be made to capture Cu, Ni or other metals by gettering.

Moreover, it can be prevented that the distortion or dislocation occurring upon formation of micro defects BMD does affect the epitaxial layer EP in the surface layer zone 42. Since a distortion (tensile stress) is produced along the epitaxial interface due to a difference in lattice constant, the epitaxial interface prevents the distortion by formation of micro defects, which will cause a compression stress, from reaching to the epitaxial layer EP as the device active layer that is, the subsidiary effect of relaxing the distortion by the epitaxial interface can be obtained. To confirm it, misfit dislocation was intentionally produced along the epitaxial interface by excessive processing. As a result in sample F where micro defects BMD were made near the surface, dislocation density was lower than wafers without micro defects BMD.

These results lead to the following presumption. Although the series of tests made on CZ wafers were conducted by making samples by directly bonding two kinds wafers different in micro defects BMD, their results was same as the result obtained by using epitaxial wafers. Epitaxial wafers, especially those doped high-concentrated boron, size distribution of micro defects BMD exhibits a very moderate change as compared with bonded wafers. Nevertheless, the same results was obtained this means that changes in size of micro defects BMD do not contributed so much to improvement of mechanical strength, it would be important that micro defects BMD in the inner deep layer zone are smaller in size than micro defects BMD in the intermediate layer zone near the semiconductor wafer.

(Third Embodiment)

The third embodiment of the invention makes sample G by processing sample A used in the first embodiment by hydrogen annealing at 1200° C. for two hours.

Figures 5, 5A:
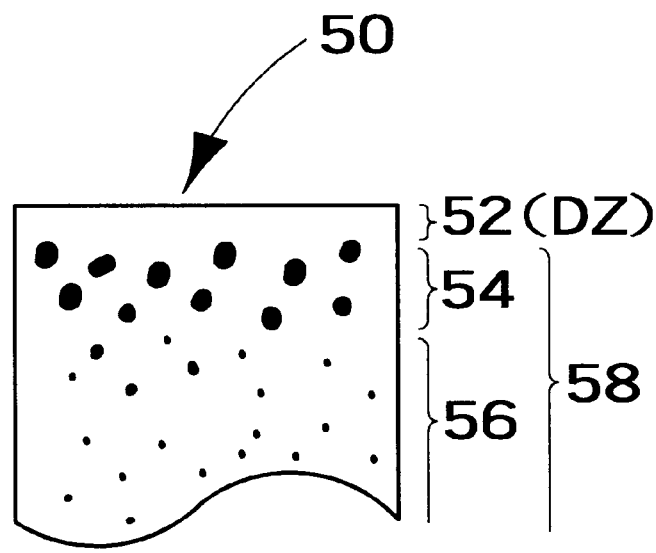
FIG. 5 is a fragmentary cross-sectional view of a semiconductor wafer according to the third embodiment of the invention.
FIG. 5A is a flow chart of a manufacturing,, process of the semiconductor wafer (sample G) according to the third embodiment of the invention.

FIG. 5 is a fragmentary cross-sectional view of the semiconductor wafer 50 as sample G according to the third embodiment of the invention. Sample G can be made by processing a wafer for making sample A by hydrogen annealing at 1200° C. for two hours.

As shown in FIG. 5, the semiconductor wafer 50 has the to surface layer zone 52 in which the denuded zone DZ is formed. The intermediate layer zone 54 underlying the surface layer zone 52 and the deep layer zone 56 under the intermediate layer zone 54 have formed micro defects BMD. These micro defects BMD formed in the intermediate layer zone 54 and the deep layer zone 56 becomes smaller in size as getting deeper, but are constant in density. The intermediate layer zone 54 and the deep layer zone 56 form the inner layer zone 58.

The density of micro defects BMD of sample G is not so high as sample F. However, the size of micro defects BMD immediately under the denuded zone DZ of sample G is larger than that of sample F.

Next explained is a manufacturing method of sample G. As mentioned above, sample G is made by annealing a CZ wafer in hot hydrogen. Here is used the wafer for making sample A having the oxygen concentration of $1.7 \times 10^{18}$ cm$^{-3}$, and hydrogen annealing is done at 1200° C. for two hours. While the temperature is increased from the temperature for introducing the wafer into the furnace (~800° C.) to 1200° C., the carrier gas is chanced from $N_2$ to $H_2$. The lower the temperature upon changing to $H_2$, the clearer the size distribution of micro defects BMD. The flow of the process explained above is shown in FIG. 5A.

Sample G can be maximized in density of micro defects BMD in the intermediate layer zone 54 immediately under the denuded zone DZ by optimizing the temperature for introducing the wafer into the furnace and the time for heating to 1200° C.

That is, hydrogen annealing appears to make a size distribution of micro defects in the mechanism explained below. At the initial stage, precipitating rate of solid solution oxygen to precipitation sites is accelerated by hydrogen diffused from the surface. Additionally, due to the relation between a decrease in precipitation rate by external diffusion of oxygen and an increase in precipitation critical site size by an increase in temperature, precipitation of oxygen made in the surface layer zone 52, namely, micro defects BMD, gradually disappear. Therefore, it is possible to change the size of micro defects by controlling the initial hydrogen annealing temperature, temperature increasing rate, the maximum temperature, and so on.

As explained above, also in the semiconductor wafer 50 as sample G according to the third embodiment, similarly to the first and second embodiments, micro defects BMD are made in the intermediate layer zone 54 of the semiconductor wafer 50, and micro defects BMD smaller in size the the former are formed in the deep layer zone 56. Therefore, it is possible to maintain its gettering performance against metal impurities while ensuring mechanical strength of the semiconductor wafer 50.

That is, according to sample G, concentration of metal impurities in the surface layer zone 52 can be made lower than sample A with a uniform size of micro defects BMD.

When measuring sample G by IR tomography, intensity distribution of scattering light by micro defects BMD has a maximum value within the depth of approximately 50 μm from the surface, and gradually decreases as getting deeper, similarly to Sample F. At the depth of approximately 150 μm from the surface, intensity distribution of scattering light becomes substantially constant. Relative intensity of the scattering light is confirmed to change by double or more, similarly to the former example.

(Optimization of Manufacturing Process)

Next considered is optimization of manufacturing sample F as the epitaxial wafer and sample G which is a hydrogen annealed wafer. As to bonded wafers, a desired distribution of micro defects is obtained by making micro defects BMD and denuded zones DZ before bonding both wafers, their optimization is not discussed here.

Figure 6:
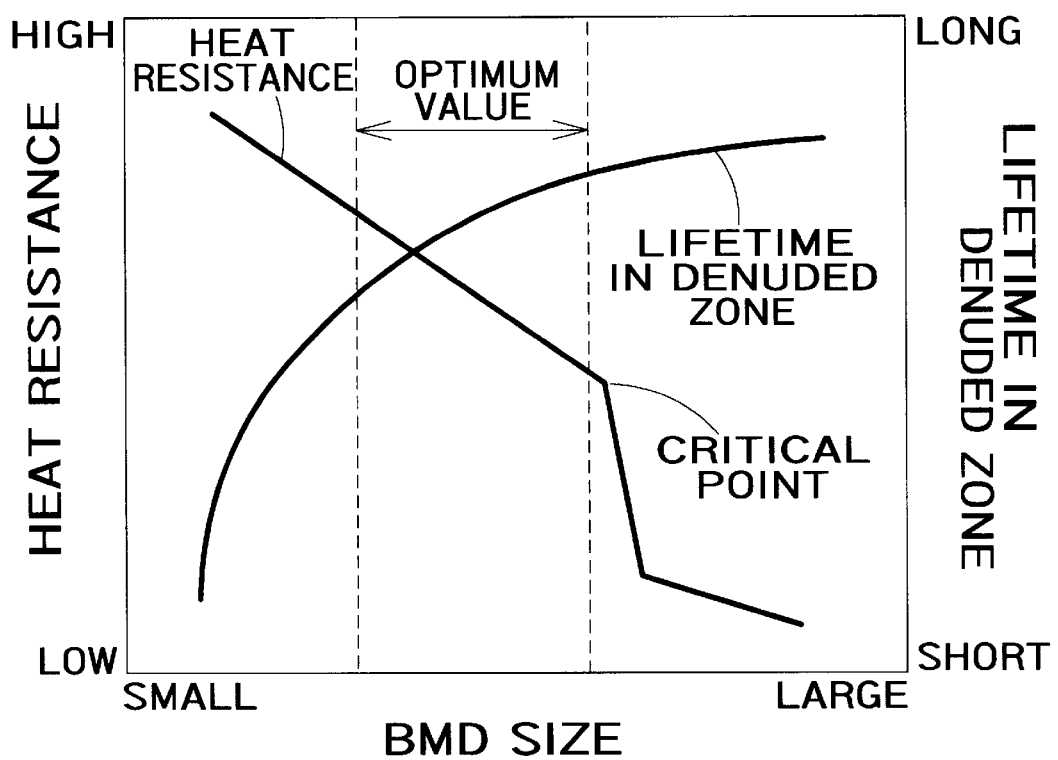
FIG. 6 is a diagram showing the relation of relative heat resistance and carrier lifetime depending on the size of micro defects in samples F and G.

In both the sample F, which is an epitaxial wafer, and the sample G, which is a hydrogen-annealed wafer, the tendency shown in FIG. 6 was observed. In FIG. 6, the horizontal axis shows sizes of micro defects in the intermediate layer zones 44, 54 immediately under the surface layer zones 42, 52. The left vertical axis shows resistance to heat of the semiconductor wafers. The right vertical axis shows lifetime of carriers in the denuded zone DZ.

As shown in FIG. 6, as the size of micro defects increase, generation carrier lifetime (MOS-τ) in the denuded zones DZ in the surface layer zones 42, 52 is improved. However, when the size of micro defects becomes larger, the stress in the crystal increase, and causes dislocation around micro defects BMD at a certain critical point. As from point where dislocation occurs, mechanical strength of the semiconductor wafer deteriorates significantly.

Also in a CMOS device, the annealing time is shortened remarkably. Therefore, it is recommended to previously make micro defects BMD of $1 \times 10^6 \sim 5 \times 10^9$ cm$^{-3}$ than relying on making micro defects BMD in the process.

In case of sample F, which is an epitaxial wafer, when devices were made after annealing the wafers at 700° C., micro defects BMD immediately under the denuded zone DZ, which is an epitaxial layer, had the largest size of micro defects in those annealed for one hour. In those annealed for eight hours, such large-sized micro defects were not found. Therefore, in order to ensure an optimum distribution of micro defects BMD, it is recommended to previously anneal the wafer before introducing the wafer into the furnace for the device production process, taking it into consideration which annealing will be done in the device production process.

According to the knowledge of the Inventor obtained through experiments, for the annealing executed at 800° C. or lower before the initial annealing at 1000° C. in the main process, a duration of time and a temperature of annealing, which are determined to make the annealing equivalent to the annealing at 650° C. for seven hours, will be the best condition. When diffusion coefficient of oxygen in Si under T° C. is DT, and the annealing duration of time is t, the term "equivalent" used here means that $$2(DT \cdot t)^{0.5}$$

be equal between the selected conditions and the annealing at 650° C. for seven hours. That is, thermal condition is for equalizing the diffusion length of solid solution oxygen atones are selected.

In case of sample G, which is an hydrogen-annealed wafer, since the specific resistance of the semiconductor wafer is several Ωcm, different annealing from sample F using a low-resistance substrate was necessary. That is, density of micro defects BMD is substantially determined by the hydrogen annealing conditions. If the hydrogen annealing temperature was 1200° C., large-sized micro defects BMD could be formed in the intermediate layer 54 directly under the denuded zone DZ by introducing the wafer into the furnace and starting the annealing at 700° C., and then raising the temperature to 100° C. by the rate of 6° C. per minute or lower.

(Test of Electric characteristics)

Sample F, which is an epitaxial wafer, was tested to review metal contamination and electric characteristics of its gate oxide film. For this purpose, a MOS capacitor having a 7 nm thick oxide film was made in sample F, and intentionally contaminated with Cu. Thus, the time zero dielectric breakdown and time dependent dielectric breakdown (TDDB) of the oxide film were measured.

FIG. 7 is a graph showing results of the measured initial insulation property to pressure of the oxide film. For comparison purposes, another sample F' was prepared. Sample F' had the same structure as sample F, but micro defects. BMD were not made. Initial insulation property to pressure of the oxide film was investigated on a large number of these samples F and F', and the results are shown in FIG. 7.

As shown in FIG. 7A, in sample F, the oxide film was suddenly broken at a certain threshold voltage. In the test explained here, breakdown of the oxide film occurs approximately at 7 MV/cm. Substantially no difference in threshold voltage was found among individual semiconductor wafers. In contrast, as shown in FIG. B, in sample F', the current flowing in the oxide film begins to increase with a lower voltage in some semiconductor wafers. That is, there is a large difference in threshold voltage causing breakage of the oxide film. This is because metal contamination in semiconductor wafers as sample F' contaminated the oxide film. On the other hand, in Sample A, micro defects BMD capture the contaminating metal by gettering, and influence by metal contamination does not appear.

In contrast, the same effect was obtained with samples in which micro defects BMD were made. However, considering that the expense required for making micro defects into consideration, the density of micro defects of Sample F will sufficient. When a huge number of micro defects BMD are made, the mechanical strength decreases unacceptably. Moreover, even when micro defects are made along the bottom surface with a high density, they are too distant from the front surface to behave as gettering sites. These effects of by the distribution and density of micro defects apparently appeared also as a difference in frequencies of random failure of TDDB.

The invention is not limited to the specific embodiments explained above, but may be changed or modified in various modes. For example, in the first embodiment, sample B and sample C may be combined to make the density of micro defects BMD in the deep layer 16 be lower than the density in the intermediate layer 14 and to make the size of micro defects in the deep layer 16 be smaller than the size in the intermediate layer 14.

As described above, according to the invention, in the semiconductor device made by forming a semiconductor element on a semiconductor substrate, a denuded zone least unlikely to produce oxygen precipitation is made in a surface, layer where the semiconductor element, and precipitation amount of oxygen decreases as getting deeper in an inner layer portion directly under the surface layer. Therefore, the device maintains its gettering performance while ensuring mechanical strength.

What is claimed is:

1. A semiconductor device including a semiconductor element on a semiconductor substrate, comprising:

a denuded zone extending along a surface layer zone of said semiconductor substrate nearer to a location in which said semiconductor element is formed, said denuded zone having a lowest density of defects; and an inner layer zone underlying and adjacent said denuded zone, the quantity of precipitated oxygen in said inner layer zone decreasing as the depth progresses.

2. The semiconductor device according to claim 1 wherein said semiconductor substrate is made by forming an epitaxial layer on a wafer in which boron is distributed by the density of $10^{19}$ per cubic cm, and by annealing said epitaxial layer.

3. The semiconductor device according to claim 1 wherein said semiconductor substrate is made by processing a wafer by hydrogen annealing at a temperature not lower than 1000° C.

4. A semiconductor device including a semiconductor element on a semiconductor substrate, comprising:

a denuded zone extending along a surface layer zone of said semiconductor substrate nearer to a location in which said semiconductor element is formed, said denuded zone having a lowest density of defects; and an inner layer zone underlying and adjacent said denuded zone, the size of micro defects caused by precipitation of oxygen in said inner layer zone getting smaller and/or the quantity of micro defects in said inner layer zone decreasing as the depth progresses.

5. The semiconductor device according to claim 4 wherein the size of the largest one of said micro defects is at least 1.1 times the size of the smallest one of said micro defects.

6. The semiconductor device according to claim 4 wherein, when said micro defects are observed by an infrared laser, the maximum value of optical intensity of scattered light of the infrared laser is at least twice the minimum value.

7. The semiconductor device according to claim 4 wherein concentration of interstitial oxygen in the surface layer zone having formed said denuded zone is higher than concentration of interstitial oxygen in said inner layer zone having formed said micro defects.

8. A semiconductor device comprising:

a surface layer zone in which a denuded zone having the lowest density of defects, said denuded zone including a semiconductor element formed therein;

an intermediate layer zone underlying and adjacent said surface layer zone, and having formed a number of micro defects for gettering of impurity metal; and a deep layer zone underlying and adjacent said intermediate layer zone, and having formed a number of micro defects for gettering of impurity metal, said micro defects in said deep layer zone being smaller in size than said micro defects in said intermediate layer zone, and/or said micro defects in said deep layer zone being lower in density than said micro defects in said intermediate layer zone.

9. The semiconductor device according to claim 8 wherein the size of each said micro defect in said intermediate layer zone is at least 1.1 times the size of each said micro defect in said deep layer zone.

* * * * *